US007555270B2

United States Patent
Chao et al.

(10) Patent No.: US 7,555,270 B2
(45) Date of Patent: *Jun. 30, 2009

(54) WIDE DYNAMIC RANGE POWER DETECTION IN A COMMUNICATION SYSTEM

(75) Inventors: Yen-Fang Chao, Pleasanton, CA (US); Cuong Nguyen, San Jose, CA (US)

(73) Assignee: Harris Stratex Networks Operating Corporation, Morrisville, SC (US)

( * ) Notice: Subject to any disclaimer, the term of this patent is extended or adjusted under 35 U.S.C. 154(b) by 81 days.

This patent is subject to a terminal disclaimer.

(21) Appl. No.: 11/679,025

(22) Filed: Feb. 26, 2007

(65) Prior Publication Data

US 2007/0142006 A1    Jun. 21, 2007

Related U.S. Application Data

(63) Continuation of application No. 10/443,157, filed on May 21, 2003, now Pat. No. 7,228,114.

(51) Int. Cl.
*H04B 17/00* (2006.01)
(52) U.S. Cl. .................. 455/115.1; 455/126; 455/127.2
(58) Field of Classification Search .............. 455/115.1, 455/115.4, 117, 126, 127.1, 127.2, 127.3; 330/129
See application file for complete search history.

(56) References Cited

U.S. PATENT DOCUMENTS

| | | | |
|---|---|---|---|
| 4,019,150 A | 4/1977 | Lurey et al. |
| 4,490,681 A | 12/1984 | Turner |
| 4,983,981 A | 1/1991 | Feldman |
| 5,081,713 A | 1/1992 | Miyazaki |
| 5,113,416 A | 5/1992 | Lindell |
| 5,126,686 A | 6/1992 | Tam |
| 5,126,688 A | 6/1992 | Nakanishi et al. |
| 5,208,550 A | 5/1993 | Iwane |
| 5,214,393 A | 5/1993 | Aihara |
| 5,335,369 A | 8/1994 | Aisaka |
| 5,371,473 A | 12/1994 | Trinh et al. |
| 5,392,464 A | 2/1995 | Pakonen |
| 5,515,008 A | 5/1996 | Ueda et al. |

(Continued)

OTHER PUBLICATIONS

International Search Report for Stratex Networks, Inc., PCT/US04/05370, Sep. 23, 2004, 3 pages.

*Primary Examiner*—Blane J Jackson
(74) *Attorney, Agent, or Firm*—Sheppard, Mullin, Richter & Hampton LLP

(57) ABSTRACT

Power detection system and method provide for a wide dynamic range power detection. The system may incorporate a coupler to sample a transmitted or received power. Such sampled power is then directed to a detector configured to generate a voltage from its rectified current. Such voltage after optional filtering and buffering is directed to multiple amplifiers wherein each amplifier has a distinct associated gain. For improved noise immunity, a differential output amplifier may be used. For low power levels, the output of an amplifier with a large gain is directed to an analog-to-digital converter (ADC), wherein the analog voltage is quantized into a digital value. As power is increased, the output of an amplifier stage with a smaller gain can then be directed to the ADC such that saturation of the ADC is avoided. Hysteresis is implemented so to avoid undesirable and unnecessary rapid switching.

25 Claims, 7 Drawing Sheets

U.S. PATENT DOCUMENTS

| | | |
|---|---|---|
| 5,640,691 A | 6/1997 | Davis et al. |
| 5,661,442 A * | 8/1997 | Sparks ..................... 332/149 |
| 5,678,209 A | 10/1997 | Strakovsky |
| 5,732,334 A * | 3/1998 | Miyake ..................... 455/126 |
| 5,826,177 A * | 10/1998 | Uno ........................... 455/126 |
| 5,832,373 A | 11/1998 | Nakanishi et al. |
| 6,002,922 A | 12/1999 | Schwent |
| 6,038,432 A | 3/2000 | Onoda |
| 6,108,527 A | 8/2000 | Urban et al. |
| 6,121,925 A | 9/2000 | Hilliard |
| 6,128,477 A | 10/2000 | Freed |
| 6,320,913 B1 | 11/2001 | Nakayama |
| 6,397,090 B1 | 5/2002 | Cho |
| 6,615,028 B1 | 9/2003 | Loke et al. |
| 6,678,506 B1 | 1/2004 | Dolman et al. |
| 6,920,334 B1 * | 7/2005 | Karsi et al. ................. 455/522 |
| 7,027,785 B2 * | 4/2006 | Summers et al. ............ 455/126 |
| 2004/0166826 A1 * | 8/2004 | Chaoui ....................... 455/333 |

* cited by examiner

WIDE DYNAMIC RANGE POWER DETECTION IN A COMMUNICATION SYSTEM

REFERENCE TO EARLIER FILED APPLICATIONS

This application is a continuation of and hereby incorporates by reference U.S. patent application Ser. No. 10/443,157, on May 21, 2003, entitled "WIDE DYNAMIC RANGE POWER DETECTION SCHEME."

INTRODUCTION

1. Field

The present invention relates generally to the field of electronic communications. More particularly, the present invention relates to the power measurement and control of a signal transmitted over a medium.

2. Background

In developing a communications system, it is generally advantageous for a communications link to utilize the strongest signal feasible for improving signal quality and for providing sufficient coverage or range. With regard to signal quality, a stronger signal yields a higher signal-to-noise ratio (SNR). Also, a stronger signal propagates a further distance. However, the power level of transmitted signals must be constrained within limits. For example, in most situations, transmission power levels are regulated under rules imposed by governmental agencies such as the Federal Communications Commission (FCC). Indeed, this is important so as to prevent one or more powerful signals from interfering with the communications of other signals in the same frequency range. Other restrictions may be imposed by standards committees or may be self-imposed by a system in order to minimize interference where several signals are expected to exist simultaneously.

In view of the above, an important consideration in designing a communication system is its performance over a wide temperature range. It has been observed that the characteristics of a communication system change over temperature in such a way that its transmission power is affected. For example, while maintaining all other conditions constant, a communication system can transmit lower power levels at elevated temperatures and it can transmit higher power levels at very cold temperatures, and vice-versa.

Whatever the characteristics of a communications system may be, it is nonetheless desirable to closely monitor and control the transmission power. It is therefore important to know the transmission power levels of communication system. A common scheme for monitoring or detecting a system's radio frequency (RF) power is through the use of a semiconductor Schottky barrier diode. RF detectors are essentially low sensitivity receivers which function on the basis of direct rectification of an RF signal through the use of a non-linear resistive element—a diode. Generally detectors using Schottky diodes can be classified into two distinct types: the small-signal type, also known as square-law detectors; and the large-signal type, also known as linear or peak detectors. In operation, a small-signal detector is dependent on the slope and curvature of the VI characteristic of the diode in the neighborhood of the bias point. The output of the detector is proportional to the power input to the diode. That is, the output voltage (or current) of the detector is proportional to the square of the input voltage (or current), hence the term "square law." Large-signal detector operation is dependent on the slope of the VI characteristics in the linear portion, where the diode functions essentially as a switch. In large-signal detection, the diode conducts over a portion of the input cycle and the output current of the diode follows the peaks of the input signal waveform with a linear relationship between the output current and the input voltage.

The square law dynamic range may be defined as the difference between the power input for a 1 dB deviation from the ideal square law response (compression point) and the power input corresponding to the tangential signal sensitivity (TSS). TSS is a measure of low level sensitivity with respect to noise. Normal operating conditions for the Schottky detector, a square-law detector, call for a large load resistance (100 k$\Omega$) and a small bias current (20 $\mu$A). These normal conditions assure the minimum value of TTS, but not the maximum value of compression level.

One conventional manner of raiding the compression level is by reducing the value of the load resistance, RL. But the sensitivity degrades by the factor RL/(RL+RV), where RV is the diode's specified video resistance. The degradation in TSS can exceed the improvement in compression, such that there is no improvement in square lay dynamic range. Another conventional technique for raising the compression level is to increase the bias current. This also degrades the sensitivity, but the improvement in compression exceeds this degradation so square law dynamic range is increased. Although these approaches may improve a detector's general performance, they do not significantly improve a detector's dynamic range.

With regard to a communication system, it is important to know its transmission power level at particular temperatures of operation. Conventional approaches have used a power detector and a temperature sensor so as to develop calibration table. In conventional calibration methods, the entire communication system is exercised at various temperatures while noting the output of the detector module. When placed in service, the communication system would then retrieve calibration data at a measured temperature so as to accurately measure the system's transmission power. Such conventional calibration methods, however, necessarily required that the entire system, or at least a large part of it, be placed in a temperature chamber. Because of the size and mass of such configurations, the calibration system is slow. Moreover, because an entire system is calibrated, and changes in components, such as upon a failure, required re-calibration.

SUMMARY

The present invention as embodied and broadly described herein provides advantages over conventional methods by providing accurate measurements of a communication system's transmission power over an extended dynamic range. In one embodiment, a method for detecting power of a communication system may comprise: providing a source signal that has a power level within a range; generating a detector signal with a magnitude relative to power level of the source signal; generating a plurality if amplified detector signals each of which being a product of amplification by a gain of the detector signal, each gain being distinct and having a predetermined gain value; selecting as an output signal one of the plurality of amplified detector signals; switching the selection as output signal to another one of the plurality of amplified detector signals in response to the output signal reaching one of a plurality of thresholds, wherein the plurality of thresholds are predetermined, in a pre-calibration, based on the predetermined gain values and amplitudes of the output signal in order to substantially avoid saturation and sense detectable power levels across the range; and associating the power level to the output signal, wherein the switching increases the range of power levels that are detectable.

In another possible embodiment, a system for detecting power in a communication system may include: means for providing a source signal that has a power level within a range; means for generation a detector signal with a magnitude relative to the power level of the source signal; means for generating a plurality of amplified detector signals each of which being a product of amplification by a gain of the detector signal, each gain being distinct and having a predetermined gain value; means for selecting as an output signal one of the plurality of amplified detector signals; means for switching the selection as output signal to another one of the plurality of amplified detector signals in response to the output signal reaching one of a plurality of thresholds, wherein the plurality of thresholds are predetermined, in a pre-calibration, based on the predetermined gain values and amplitudes of the output signal in order to substantially avoid saturation and sense detectable power levels across the range; and means for associating the power level to the output signal, wherein the switching increases the range of power levels that are detectable.

The method may include coupling a portion of the source signal to produce the detector signal. The method may also include filtering and/or buffering the detector signal, for example, prior to amplifying the detector signal. The source signal may be a radio frequency (RF) signal.

BRIEF DESCRIPTION OF THE DRAWINGS

The accompanying drawings, which are incorporated in and form a part of this specification, illustrate embodiments and, together with the description, serve to explain the principles of the present disclosure.

DETAILED DESCRIPTION

Figure 1:
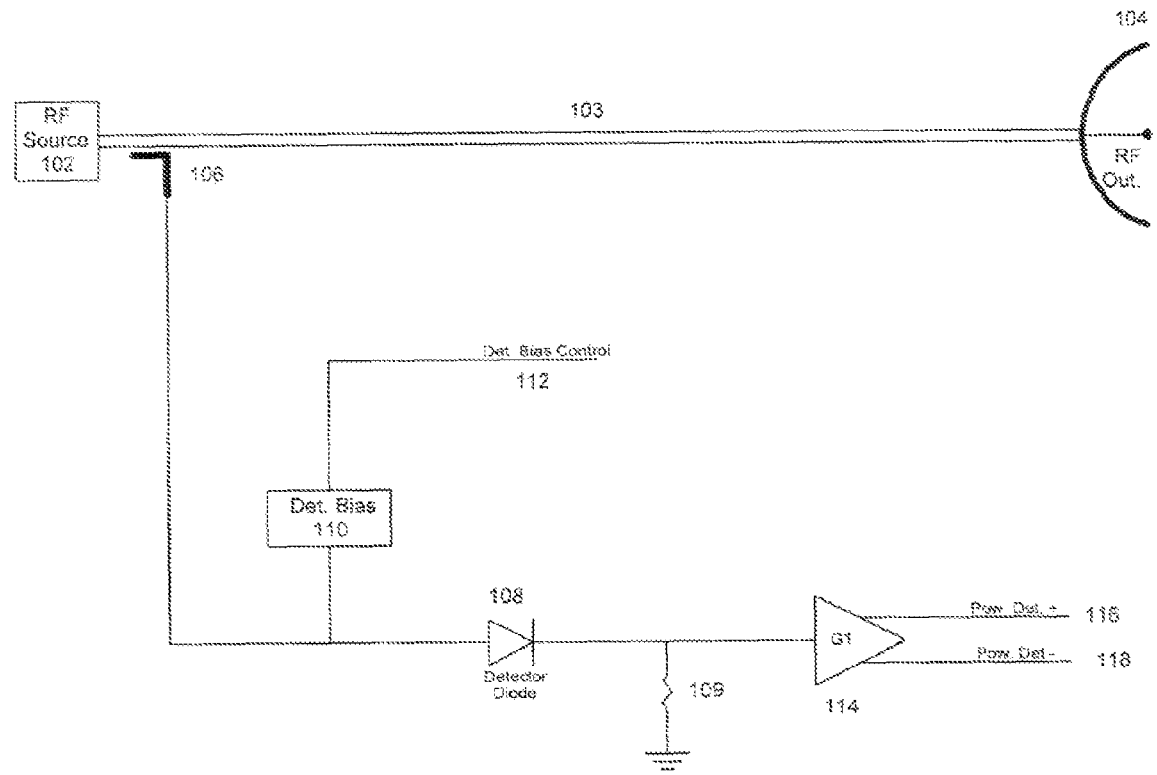
FIG. 1 is a schematic diagram of a configuration for measuring a power signal.

The present invention provides a new transceiver power detection architecture. A representative embodiment of the new architecture calls for placement of a detector module at or near the transceiver output/input (e.g., at or near the antenna connection point). Moreover, the present invention provides a new detector module that provides a wide power detection range.

According to an aspect of the invention, a power detection circuit incorporates a coupler to sample a transmitted or received power. Such sampled power is then directed to a detector diode configured to generate a voltage from its rectified current. Such voltage after optional filtering and buffering is then directed to multiple amplifiers wherein each amplifier has a distinct associated gain. For improved noise immunity, a differential output amplifier may be used. For low power levels, the output of an amplifier with a large gain is directed to an analog-to-digital converter (ADC), wherein the analog voltage is quantized into a digital value. As power is increased, the output of an amplifier stage with a smaller gain can then be directed (e.g., switched) to the ADC such that saturation of the ADC is avoided. A circuit with two amplifiers will be described, however, the present invention is not so limited. In fact, more stages can be implemented to extend the dynamic range of the detection circuit over a wider range.

According to another aspect of the invention, a power detector module with a small associated thermal mass is advantageously placed near a transceiver's output, such as an antenna, so as to provide accurate measurements of the transceiver's output power. Moreover, the power detector module is calibrated over a wide range of temperatures such that a power detector module reading at a particular temperature can be accurately associated with a calibrated output power. In response to an accurate measurement of the output power, an input signal of the transceiver can be attenuated or amplified, so as to closely control its output power. In the discussion to follow attenuation or amplification will generally be referred to as amplification where it is understood that amplification can produce a gain equal to or greater than one (i.e., $A \geq 1$) or a gain equal to or less than one (i.e., $A \leq 1$), also referred to as attenuation; moreover, buffering is achieved with a gain equal to one (i.e., $A=1$). Where amplification is mentioned, gain or attenuation is also appropriate. Although the discussion focuses for the most part of the transmitter portion, the power measurement at this physical location applies also to the input of the receiver portion of such transceiver.

In the description to follow, certain aspects of the present invention are described in detail. So as not to complicate the discussion presented here with unnecessary detail, certain aspects have been simplified. Nevertheless, because the present invention finds general application in many systems, these simplifications do not imply narrow applicability.

Shown in FIG. 1 is a schematic diagram of a circuit 100 used to measure the transmission power of a transmitter. As shown, radio frequency (RF) source 102 provides a signal having a power level RF output 104. RF output 104 can take various forms including, for example, an antenna. A transmission medium 103 is used to direct the signal from RF source 102 to RF output 104. Transmission medium 103 can take various forms including, for example, a waveguide or coaxial conductor.

The traditional approach for measuring the power of the signal emanating from RF output 104 has been to sample a small proportion of the power at RF source 102 through the use of coupler 106. RF coupler 106 can include, for example, a microstrip coupler. Coupler 106 thereby redirects a small portion of the signal to be processed by detection circuitry. It is preferred that coupler 106 redirect only a very small portion of the signal. Coupler 106 directs its sampled signal to detector diode 108.

Detector diode 108 can be, for example, a semiconductor device such as a Schottky barrier diode configured to rectify an RF signal. In operation, detector diode 108 functions as a small signal detector within its conduction region. For small currents, it may be necessary to bias detector diode 108 to place it in its conduction region. Detector bias 110 provides such a function. When the sampled signal is sufficiently large, less biasing of detector diode 108 may be necessary. Accordingly, detector bias control signal 112 may be used to properly control the amount of biasing.

Resistor 108 in conjunction with the current rectified by detector diode 108 produces a voltage that is then input to amplifier 114. Amplifier 114 has an associated and predetermined gain, G1, and is further configured to produce a differential output from a single-ended input. Power detect +signal 116 and power detect −signal 118 provide such a differential output. In a calibration process, power detect +/−signals 116/118 can be associated with known RF output 104 power levels. Thereafter, measured power detect +/−signals 116/118 can be used to determine an RF output 104 power level. A disadvantage of conventional circuit 100 is that it has a relatively narrow dynamic range that can only be extended minimally through manipulation of the detector bias. When configured to measure relatively large power levels, conventional circuit 100 may quickly become saturated. Moreover, conventional circuit 100 experiences difficulty in detecting low power levels whereby changes in voltage are of the magnitude of the quantization error of an associated ADC (see discussion of FIG. 6 below).

Figure 2:
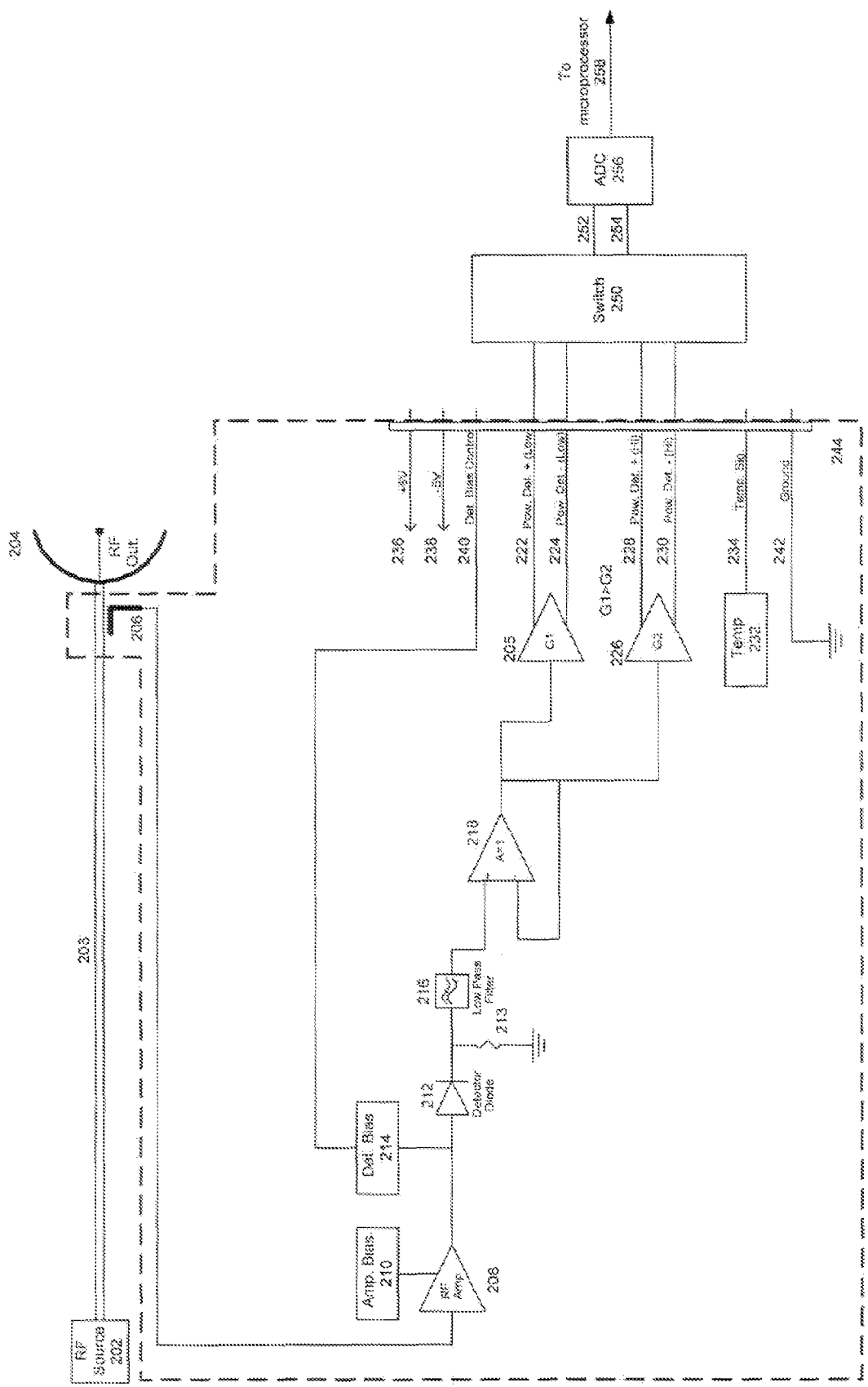
FIG. 2 is a schematic diagram of another configuration for measuring a power signal.

Shown in FIG. 2 is a schematic diagram of a wide dynamic range circuit 200 used to measure the transmission power of a transmitter according to the representative embodiment of the present invention. As shown, RF source 202 provides a signal having a power level to RF output 204. RF output 204 can take various forms including, for example, an antenna. A transmission medium 203 is used to direct the signal from RF source 202 to RF output 204. Transmission medium 203 can take various forms including, for example, a waveguide or coaxial conductor.

The power of the signal emanating from RF output 204 could have been measured by sampling the power at RF source 202 with the coupler 206 positioned at the RF source. But because the signal can degrade in the path from source 202 to RF output 204, the power is sampled in this implementation at or near RF output 204 as shown by the proximity of coupler 206 to RF output 204. RF coupler 206 can include, for example, a microstrip coupler. Coupler 206 thereby redirects a small portion of the signal at or near RF output 204 to be processed by detection circuitry according to the present invention. It is preferred that coupler 206 redirect only a small portion of the signal. Coupler 206 directs its sampled signal to RF amplifier 208 where the sampled signal is amplified to a nominal signal that is directed to detector diode 212.

Amplifier bias 210 is configured to set the appropriate gain for RF amplifier 208 such that the output of RF amplifier 208 is at a nominal level. Detector diode 212 can be, for example, a semiconductor Schottky device configured to rectify an RF signal. In this embodiment, Schottky diode detectors are used to detect small signals close to the noise level and to monitor large signals well above the noise level. For the noise level up to about −20 dBm the slope of the response curves is close to constant. This is the square law region. The diode receives the signal directly from an antenna in most systems, although a preamplifier such as RF amplifier 208 is typically used to improve sensitivity. This type of receiver, appropriate for RF applications, is used in short range radar or in counter-measure equipment where the sensitivity of a more complicated superheterodyne receiver is not needed. Above about −10 dBm the slope is closer to linear but may vary about 30% for different values of frequency, diode capacitance, and load resistance. The slope may be controlled by tuning at the proper power level.

Linear detection is used in power monitors. In some applications the linearity is important because the detected voltage is a measure of power input. In other applications, linearity is not as important because lookup tables are developed that associate a particular power level with a particular diode current or voltage, however, discernability is necessary.

Over a wide range of input, power level, P, is monotonically related to the output voltage, V. At low levels, below −20 dBm, a detector diode operates in its square law region. When DC bias current (usually microamperes) is used, the diode impedance is independent of power level such that tuning can be done at any level. Typically, a diode is tuned at −30 dBm. The detected voltage at this level is called the voltage sensitivity. At higher power levels the diode impedance changes with power. The slope is largely related to diode capacitance, frequency, and load resistance.

As previously noted, in operation, detector diode 212 is in its conduction region. For small currents, it may therefore be necessary to bias detector diode 212 to place it in its conduction region. Detector bias 214 provides such a function. When the sampled signal is sufficiently large, less biasing of detector diode 212 may be necessary. Accordingly, detector bias control signal 240 may be used to properly control the amount of biasing. Resistor 213 in conjunction with the current conducted by detector diode 212 produces a voltage that is passed through low pass filter 216 and then to amplifier 218.

Amplifier 218 can be set for unity gain so as to act as a high input impedance buffer. Indeed, any gain setting can provide a buffering effect. The buffered signal is then directed to amplifiers 205 and 226 having respective gains G1 and G2, wherein G1 is greater than G2. With regard to amplifier 218, it provides isolation of amplifiers 205 and 226 from the detector diode and further provides increased fanout without affecting the detector circuitry. In fact, an embodiment can be implements by incorporating further amplifiers having different gains.

Amplifier 205 has an associated and predetermined gain, G1, and is further configured to produce differential outputs from a signal-ended input. Power detect +signal 222 and power detect −signal 224 provide such differential outputs. In a calibration process, power detect +/−signals 222/224 can be associated with known RF output 204 power levels. Thereafter, measured levels of power detect +/−signals 222/224 are used to determine the corresponding RF output 204 power levels. Amplifier 205 is similarly configured as amplifier 226, but with gain G2 and differential +/−outputs 228/230. It is noted that G1 is a relatively large gain as compared to G2, and the different gains address different conduction regions of the detector, thereby producing the wide range gain as will be further explained below.

Circuit 200 is further configured with temperature sensor 232 to produce temperature signal 234. Accordingly, in a calibration process such as that described below, power detect +/−signals 222/224 and power detect +/−signals 228/230 as well as temperature signal 234 can be associated with known RF output 204 power levels at known temperatures. Thereafter, measured power detect +/−signals 222/224 and 228/230 and measured temperature signals 234 can be used to determined an RF output 204 power level.

Circuit 200 as shown in FIG. 2 can be built as a single module or circuit board. Moreover, circuit 200 can be incorporated into systems such as communication system 600 of FIG. 6 to be discussed below. In doing so, connector 244 provides a convenient interface to other circuitry. Connector 244 can thereby couple power detect +/−signals 222/224 and 228/230, temperature signal 234, detector bias control 240, as well as power supply +5/−5 volt inputs 236/238 are ground 242. Power supply +5/−5 volt provide the necessary power to the circuitry of circuit 200. Ground 242 provides a common reference to the circuitry of the circuit 200 as well as circuitry external to circuit 200.

Figure 3:
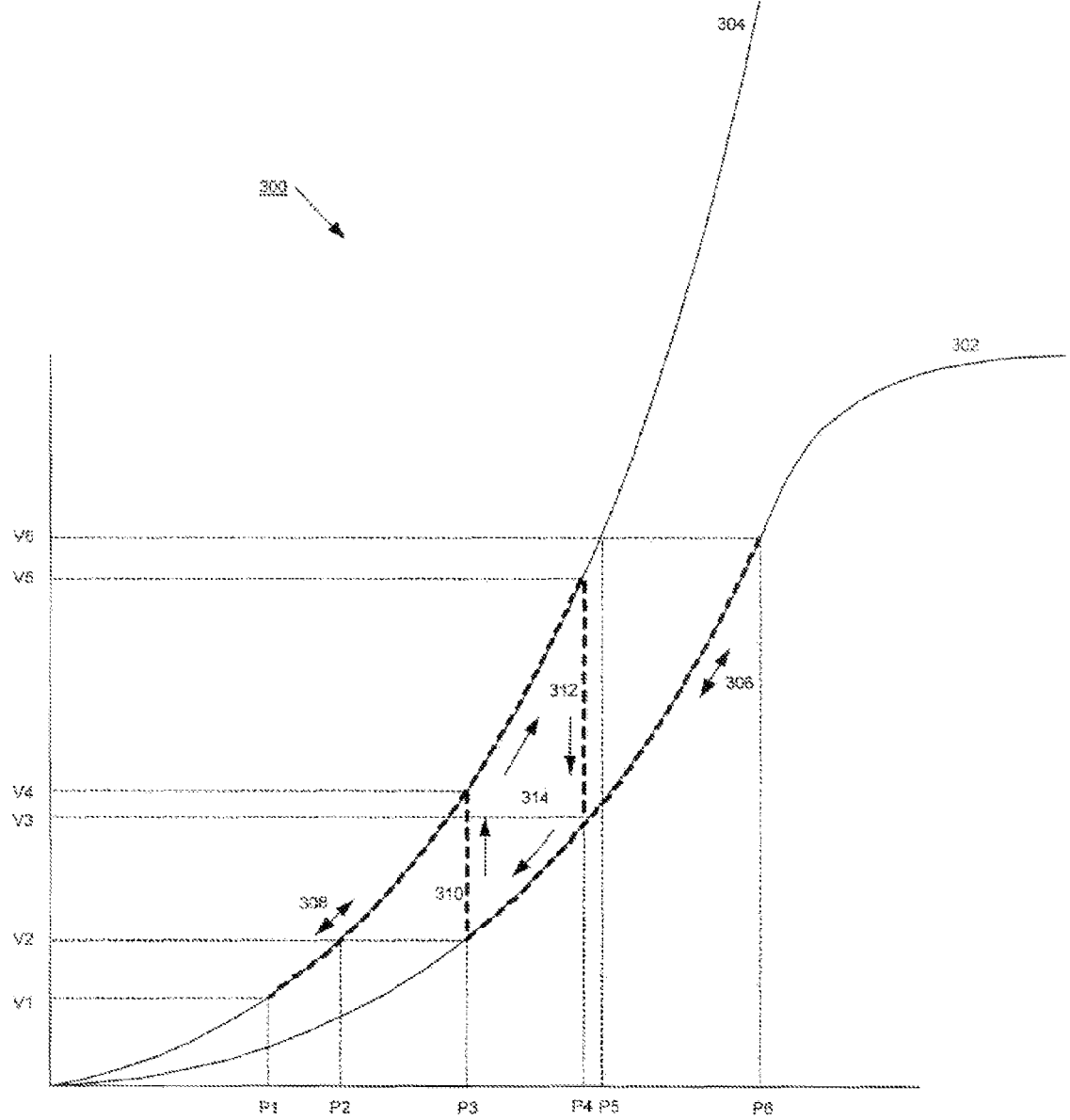
FIG. 3 is a graph of response curves for a power detection circuit.

The operation of circuit 200 can further be understood with reference to the curves of FIG. 3. As shown, curve 304 corresponds to the output of amplifier 205 that has a gain G1 greater than that of amplifier 226 that has a gain of G2. For very small currents through detector diode 212, a relatively large gain such as G1 provides adequate change in voltage for a given change in power. For example, at a power level P1 a voltage V1 is generated by amplifier 205 such that an increase from a power level P1 to an incrementally larger P1+ΔP produces an incrementally larger voltage V1+ΔV.

In increasing the power from power level P1, the voltage follows the curve 304 from V1. For example, at power level P2, amplifier 205 produces a voltage V2; at power level P3, it produces a voltage of V4; at power level P4, it produces a voltage V5. At this point, it is noted that the output voltage of amplifier 205 is approaching a maximum detectable voltage, V6 (corresponding to power level P5), of an analog-to-digital converter. Accordingly, it is undesirable to provide a voltage greater than V6, however, it may be desirable to measure power levels greater than P5 that would exceed the associated maximum voltage V6 using the gain setting of amplifier 205.

In order to prevent saturating ADC 256, among other things, circuit 200 switches over from the output of amplifier 205 to the output of amplifier 226, wherein amplifier 226 has a gain G2 that is less than the G1 of amplifier 205. Switching from amplifier 205 to amplifier 226 can be achieved in many ways, including though the use of a multiplexer or semiconductor switch 250 shown in FIG. 2. The appropriate signals are then directed to ADC 256; its output 258 is directed to a microprocessor. The transition from amplifier 205 to amplifier 226 preferably occurs at an associated voltage V5 that is less than the maximum voltage V6. Accordingly, the power level P4 has an associated voltage V5 from amplifier 205, but the same power level P4 has a lower associated voltage V3 from amplifier 226.

For power level greater than P4, amplifier 226 provides associated output voltages up to the maximum detectable power level P6 that is associated with the maximum voltage V6 along curve 302. When amplifier 226 is being used (i.e., curve 302 is being traversed), operation to amplifier 205 is not switched at power level, P4, but rather is switched at power level P3. In this way, hysteresis 314 is produced and unnecessary and frequent switching can be avoided.

Note that for power levels less than P3 along curve 302, incremental changes in power produce small changes in voltage such that difference in power level may not be discernable by an ADC. In certain situations, the changes in voltage are at the level of quantization of the ADC. In such situations, detector diode 212 may be biased more aggressively by means of detector bias 214 and detector bias control 240. Moreover, RF amplifier 208 may be biased more aggressively by means of amplifier bias 210. More conveniently, operation may be switched from amplifier 226 to amplifier 205 such that curve 304 is traversed for power levels below P3.

Figure 4:
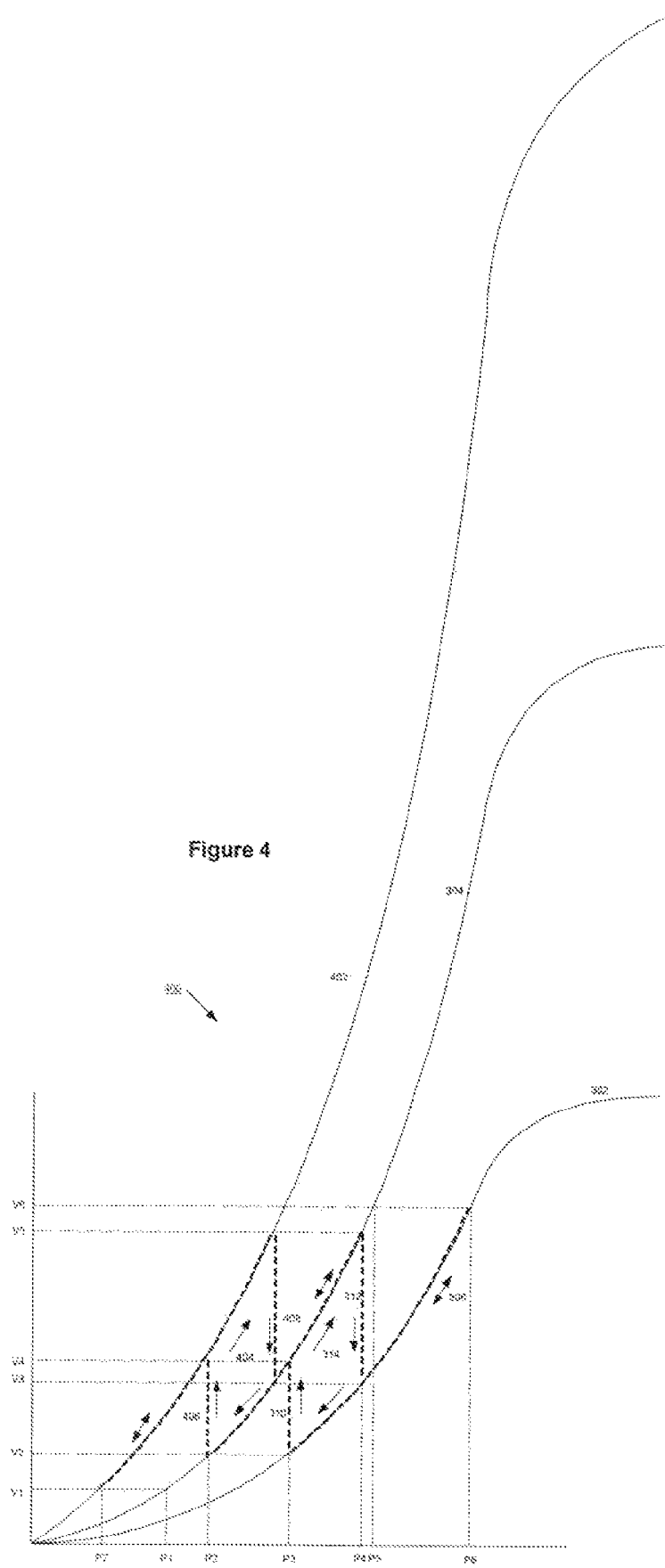
FIG. 4 is a graph of response curves for a power detection circuit.

While traversing curve 304, reduced sensitivity may nonetheless be experienced for low power levels below P1, for example, such that further amplifier stages with larger gains can be implemented. FIG. 4 shows the response curves of various outputs associated with amplifiers with different gains. Note that curves 402 has been added that is associated with an amplifier stage that has an associated gain greater than G1 of amplifier 205. Accordingly, power levels below P1 down to P7 can be detected. Traversal of the various curves 402, 302 and 304 is therefore controlled by switching amongst the various amplifiers. As before hysteresis such as hysteresis 404 is desirable to avoid unnecessary and frequent switching amongst amplifiers.

In another embodiment, the present invention addresses issues surrounding control of the output power of a radio transmitter (and monitoring of input power at the input of the receiver). Indeed, because of very tight government regulations and because of very transmitter be closely controlled.

To better understand this aspect of the present invention, however, an understanding of traditional approaches provides a useful context. A traditional approach toward measuring and, in turn, controlling transmitter output power is as shown in communication system 500 of the block diagram FIG. 5. As shown, communication system 500 comprises a transmitter 502 and receiver 504. Transmitter 502 is generally configured to modulate and condition signals for transmission over a medium (e.g., wireless medium) such as by means of antenna 526. Conversely, receiver 504 is generally configured to demodulate a signal received over a medium such as by means of antenna 526.

With regard to the transmission aspects of communication system 500, amplifier 506 is configured to receive an input signal. In certain implementations, amplifier 506 can be a variable attenuator or a variable gain amplifier. In communication system 500, the input signal generally contains information such as digital information in a modulated form (e.g., QAM modulated signal) or analog information with a specified bandwidth. The output of amplifier 506 is coupled to mixer 508. In conjunction with synthesizer 510, mixer 508 is used to up-convert the input signal to another frequency usually a higher frequency appropriate for a transmission medium being used, such as an RF for wireless communication. The amplifier 512 amplifies the RF signal to a higher power appropriate for transmission over a medium. Amplifier 512 can be in many forms including integrated circuit amplifiers, magnetrons or traveling wave tubes (TWT).

Detector module 514, containing detector diode 516, is configured to measure a detected signal level at the output of amplifier 512 within transmitter 502. This detected signal level is used to approximate the output power transmitted from antenna 526. Importantly, transmitter 502 can be a large module with many components and significant thermal mass. Signal converter 518 is provided to condition detected signals for coupling them to microprocessor 520 which in turn controls the level of amplification of amplifier 506. Signal converter 518 include detector biasing and amplification as well as filtering. By varying the amplification of amplifier 506 according to the signal detected by detector module 514, the have used microstrip proximity couplers for directing a detected signal to detector diode 516.

Signal isolator 522 is provided between amplifier 512 and diplexer 524 to minimize return losses within communication system 500. Note that in certain implementations a circulator is used in place of signal isolator 522. Whichever one is used, signal isolation is achieved to provide very closely matched signals. Diplexer 524 allows for dual transmit and receive functions within communication system 500. In certain applications, diplexer 524 is a bandpass filter that separates transmitted and received signals existing within different frequency ranges. Accordingly, an amplified RF signal generated by amplifier 512 is directed through diplexer 524 and is passed to antenna 526 for transmission over a medium, a wireless medium in this example. Conversely, where a signal is received by antenna 526, such received signal is directed through diplexer 524 and passed to receiver 504. Because details of receiver 504 are not necessary to understand the present invention, receiver 504 will not be further described.

Figure 5:
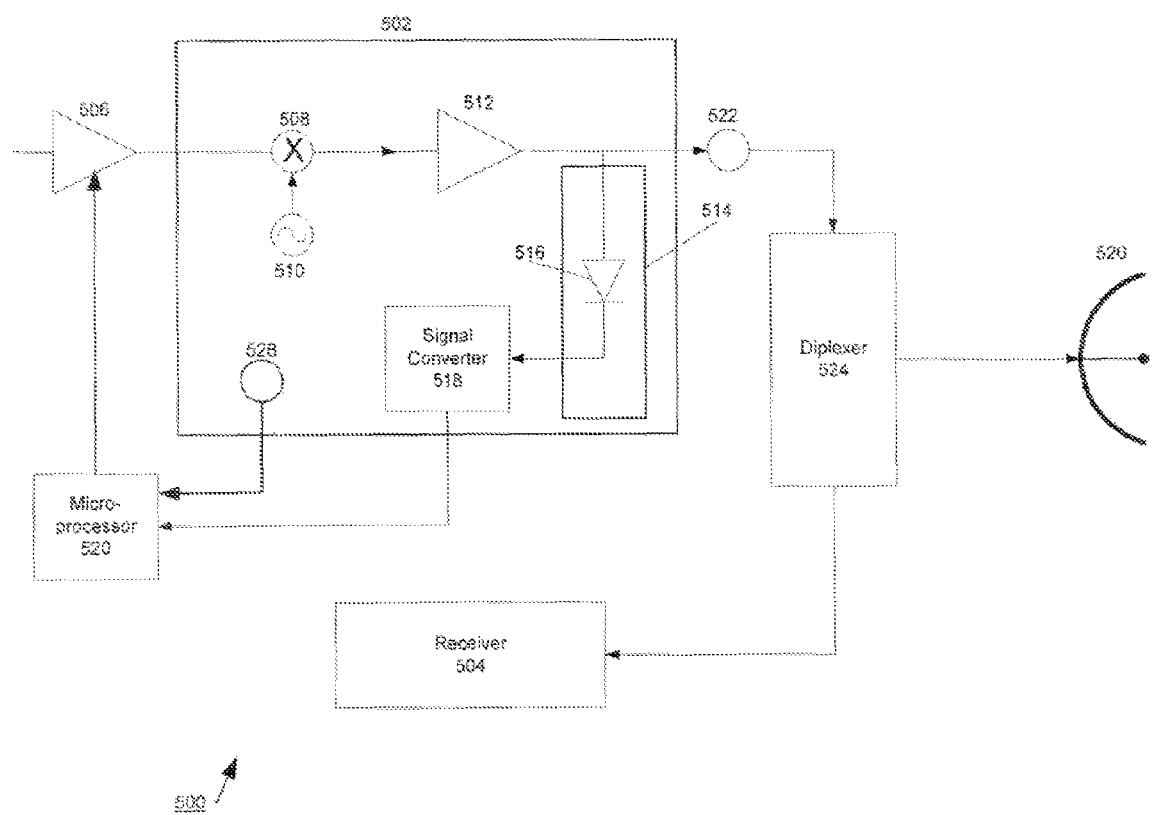
FIG. 5 is a block diagram of a traditional approach for measuring the output power of a communication system.

The traditional approach of FIG. 5 can further be understood as a control system problem wherein it is desired to control the output power of a signal exiting antenna 526 by controlling an input signal to amplifier 506. For proper control of communication system 500, observability and controllability issues must be considered. As described, the output power of a signal exiting antenna 526 is observable by monitoring the power of a signal that exists at detector module 514. However, there are intervening complications. Here we note that the output power is not observed directly, but rather in a detached and indirect way. As shown, isolator 522 and diplexer 524, with all their real-world complexities, reside between the desired signal to be observed (the output power) and the signal actually measured (the signal at detector module 514). Thus, the signal observed at detector module 514 is not a true observation of the output signal from antenna 526 such that it is necessary to account for the characteristics of more than just detector module 514 at various temperatures and frequencies over time. For example, as described, traditional approaches characterize the entire communication system 500 or at least transmitter 502 over a temperature range.

In controlling the output power of a communication system, it is further important to consider the effects of temperature where communication system 500, including transmitter 502, may be exposed to wide temperature ranges. Components of communication system 500 and in particular transmitter 502, signal isolator 522, and diplexer 524 can exhibit performance changes as a function of temperature. For example, transmitter circuitry such as that contained within mixer 508, synthesizer 510 and amplifier 512 may vary in unknown or unpredictable ways as a function of temperature. This is further exacerbated by the fact that detector module 514 (including detector diode 516) and signal converter 518 also experience changes as a function of temperature.

In order to account for changes over temperature, traditional approaches have performed temperature calibration of communication system 500 or at least transmitter 502 by enclosing them in a temperature chamber and obtaining calibration data by precisely measuring an output power level from antenna 526 at specified temperatures. In this way calibration data over a known temperature range has been associated with a transmitted output power. In operation, temperature sensor 528 would provide a temperature signal to mircoprocessor 520. Temperature sensor 528 is implemented in many forms including a temperature sensing diode or resistor. Microprocessor 520, through the use of calibration data provided in a lookup table, for example, would then convert a received detector signal to a calibrated power level. An appropriate signal would then be directed by mircoprocessor 520 to amplifier 506 which will control the output power to communication system 500 in a known way.

As described, the traditional approach to calibrating a communication system requires that the entire communication system or at least transmitter 502 be placed within a temperature chamber for calibration. Because of the thermal mass associated with even just transmitter 502, temperature calibration was a lengthy process wherein it was necessary that components be left at a particular temperature for an extended period of time so as to assure that all the components were at the specified temperature. In obtaining calibration data with fine resolution over a wide temperature range, the time and cost of calibration increases dramatically. Moreover, because communication system 500 or at least 502 can be large, a temperature chamber is limited in the number of units it can calibrate at a time.

Figure 6:
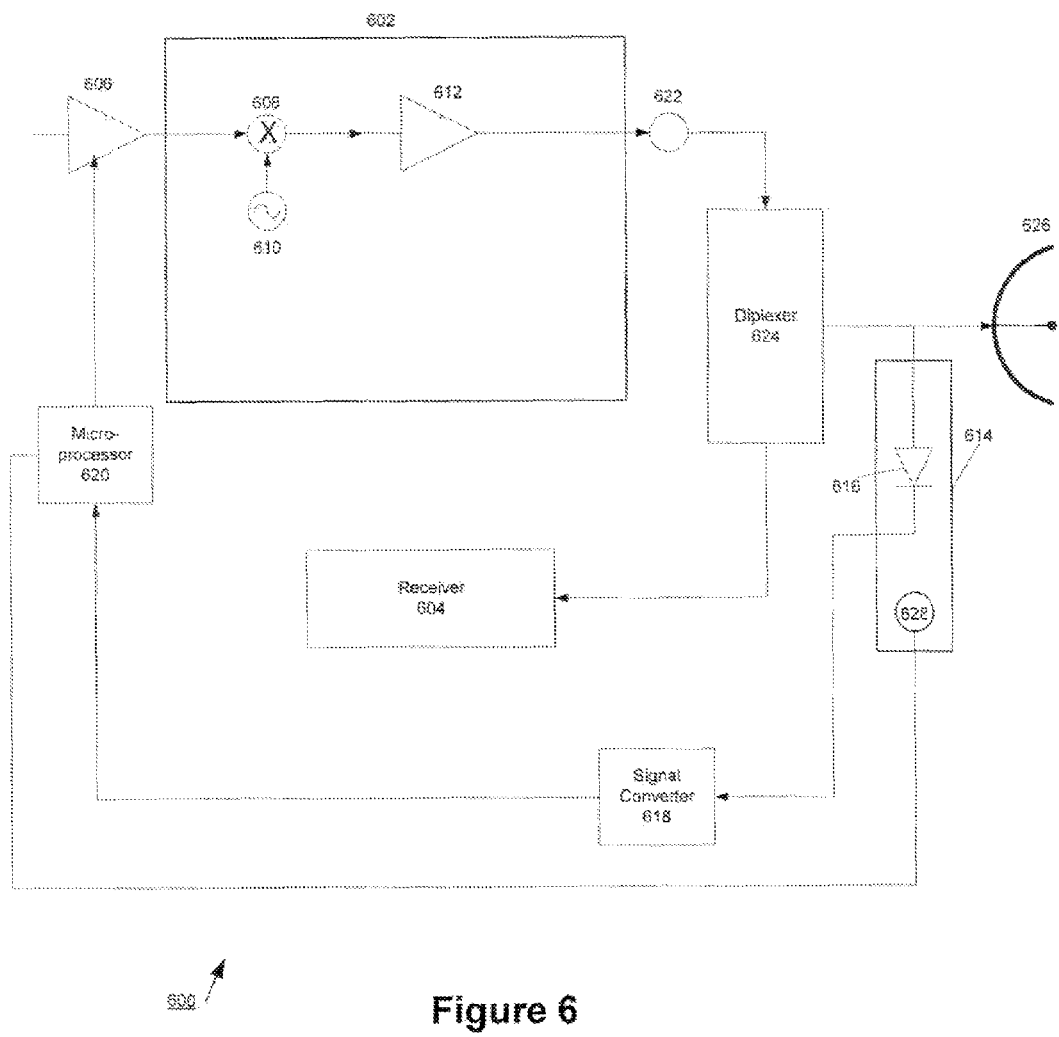
FIG. 6 is a block diagram of a representative embodiment of the new approach to measuring the output power a communication system.

With this understanding of traditional methods of calibrating communication systems, the following embodiment of the present invention can be better appreciated. FIG. 6 is a diagram of communication system 600 according to a representative embodiment of the present invention. System 600 includes receiver 604, diplexer 624 and antenna 626 much like communication system 500 of FIG. 5. But communication system 600 differs significantly from traditional approaches in the placement of detector module 614 that includes detector diode 616, signal converter 618, and temperature sensor 628.

In this embodiment, detector module 614 is placed on a substrate that further includes a waveguide coupled between the path from diplexer 624 to antenna 626, wherein diplexer 624 is used to switch between the transmission and receiving modes of communication system 600. Other types of coupling for detecting a power level are also appropriate. The position of detector module 614 close to antenna 626 allows any variations in the transmitter path (e.g., transmitter components, isolator, circulator, or diplexer filter) without degrading the calibrated power accuracy of the detector as the transmitter path varies over frequency, power, or time. In addition, the physically smaller detector module 614 allows for faster thermal cycling, improving calibration time and easing manufacturability of communications system 600.

Signal converter 618 is also provided which includes ADC that converts the analog signal from detector diode 616 into a digital signal appropriate for input to microprocessor 620. In order to do so, an ADC detects a voltage and quantizes such voltage into a digital value. The resolution of such an ADC is limited by its order. For example an 8-bit ADC that can quantize a signal over 5-volt range divides the 5-volt range into $2^8=256$ equally spaced voltage gradation whereas a 12-bit ADC divides 5-volt range into $2^{12}=4096$ equally spaced gradations. Not surprisingly, a higher order ADC has a higher associated cost and can be more complex in its integration.

In seeking to obtain accurate measurements of the output power of communication system 600 over a temperature range, the present invention does not require placing a large thermal mass, such as that of communication system 600 or transmitter 602, in a temperature chamber. With the advantageous placement of detector module 614 near the output of communication system 600, it is not necessary to calibrate the operation of the entire system. Rather, it is only necessary to calibrate detector module 614 with its associated smaller thermal mass. Indeed, it is not important that the characteristics of transmitter 602, isolator 622, or diplexer 624 change, and all that matters for calibration is that the power level of the output signal is known. This calibration can be done by passing a signal of known power level through detector module 614 over a temperature range.

The design of communication system 600 can be further understood in terms of a control system problem wherein it is desired to control the output power of a signal exiting antenna 626 by controlling an input signal to amplifier 606. Observability and controllability issues must therefore be considered. With reference to communication system 600 of FIG. 6, however, the output power of a signal exiting antenna 626, which does not vary significantly over temperature, is well observed through monitoring of the power of a signal immediately before antenna 626. Advantageously, with this architecture, there are minimal intervening complications. Here, the output power is observed almost directly instead of in an indirect way. As shown in FIG. 6, transmitter 602, isolator 622 and diplexer 624, with all their real-world complexities, reside before detector module 614. Thus, the signal observed at detector module 614 is a good observation of the output signal at antenna 626, and the only accounting needed is an accounting for the characteristics of detector module 614 over a temperature range.

It is important to note that the power of the signal measured by detector module 614 also includes a contribution from a signal receives by antenna 626. This received signal, however, is many orders of magnitude lower than the transmitted signal such that any error introduced by this signal is insignificant. For example, where communication system 600 may be transmitting at 30 dBm, it may be receiving at −60 dBm which is many orders of magnitude lower. It is further important to note that in a preferred embodiment, antenna 626 is closely matched to the rest of the system such that return losses are very low and, in turn, do not contribute in a significant amount to the measurement of detector module 614.

In light of the aforementioned complications of traditional calibration methods, it is therefore notable that, for calibration, the present invention requires placement in a temperature chamber only of the detector module. In this way, a plurality of detector modules can be calibrated within a temperature chamber at once. Moreover, because detector module 614 has a smaller thermal mass than communication system 600 or transmitter 602, detector module 614 can reach a desired temperature much faster, thereby decreasing calibration time and improving manufacturability while reducing associated costs.

In a calibration process, detector module 614 is tested at various temperatures by passing a signal of known frequency and power level through detector module 614 and measuring the output of signal converter 618. A lookup table is generated that associate signal levels from detector module 614 to known signal power levels of known frequency. After calibration, such a lookup table can then be stored in microprocessor 620 or an appropriate memory (not shown). In operation, communication system 600 and its various components including detector module 614 may operate over a wide range of temperatures. At a given temperature, however, as measured by temperature sensor 628 within detector module 614, the power level of a signal passing from diplexer 624 to antenna 626 is determined by the microprocessor 620 through the use of the lookup table. In turn, microprocessor 620 directs a signal to amplifier 606 to appropriately amplify the input signal level which then affects the output power level and the power level measured by detector module 614. A feedback loop is therefore provided through which the output power level of communication system 600 is closely controlled by knowing, in a calibrated way, the characteristics of detector module 614.

Figure 7:
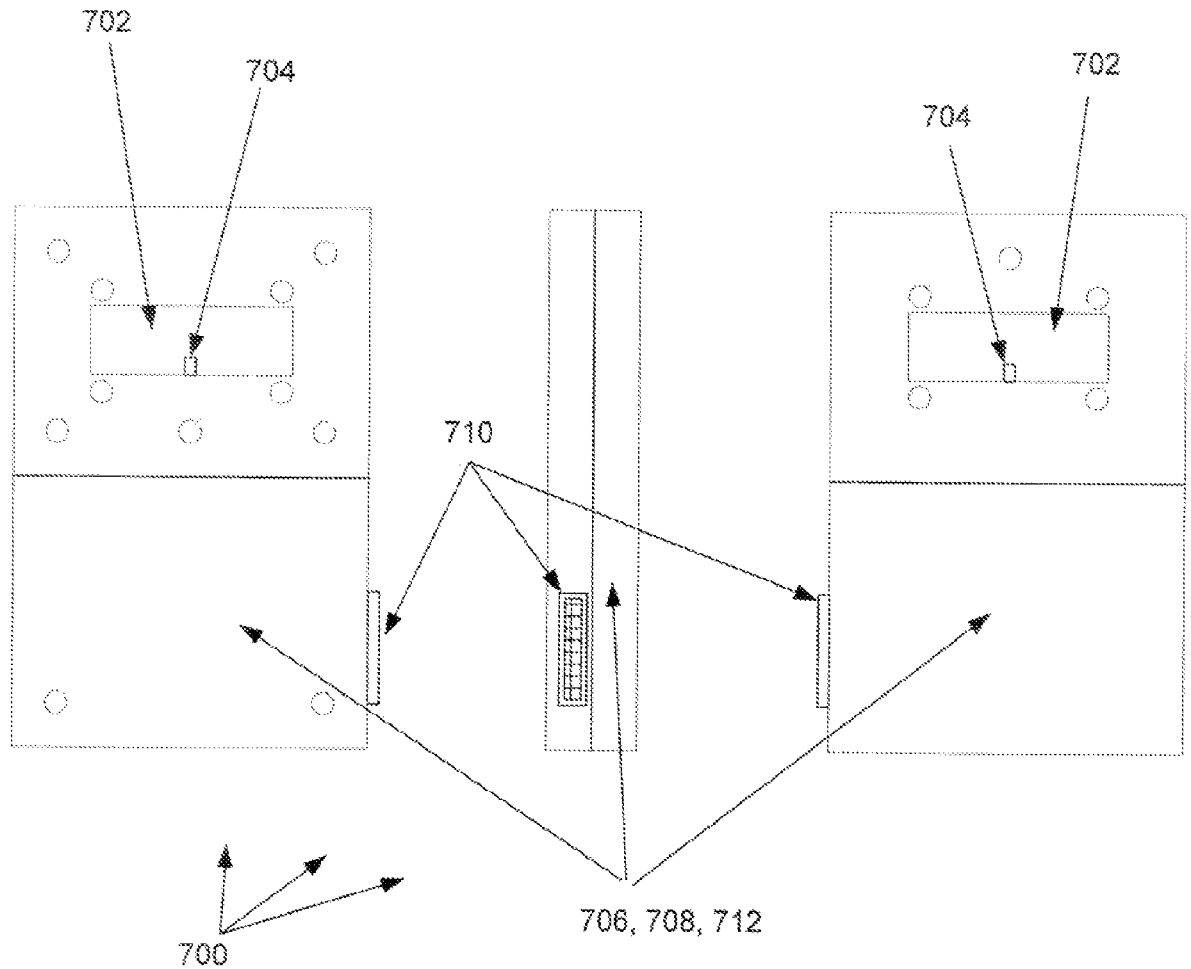
FIG. 7 is a mechanical drawing of a front, side and rear view of a detector module.

Shown in FIG. 7 is a mechanical drawing with front, side, and rear perspective of a detector module 700 according to the present invention. The dimension of waveguide 702 are provided as appropriate for signals of the required frequency. Waveguide 702 is made of conductive material. A signal such as an RF signal is coupled to detector probe 704 that is positioned to protrude into the waveguide 702 opening. Detector probe 704 is further coupled to detector circuitry 706, signal converter circuitry 708, and temperature sensor 712 which are contained within detector module 700. Although waveguide 702 is made of a conductive material, detector module 700 need not be a conductive material. Connector 710 provides an interface between the circuitry contained within detector module 700 and other components of a communication system such as a microprocessor or a transmitter (not shown). From FIG. 7, it can therefore be appreciated that the small size of detector module 700 facilitates calibration within a temperature chamber.

Described with reference to FIG. 6 was detector diode 616 and certain generally described circuitry. Whereas the system discussed above may be implemented with conventional detector diodes and circuitry, another aspect of the present invention incorporates improved circuitry that widens the dynamic operating range of the detector diode as described above.

While various embodiments and advantages have been described, it will be recognized that a number of variations will be readily apparent. Thus, the present teachings may be widely applied consistent with the foregoing disclosure and the claims which follow.

What is claimed is:

1. A method for detecting power in a communication system, comprising:

providing a source signal that has a power level within a range;

generating a detector signal with a magnitude relative to the power level of the source signal;

generating a plurality of amplified detector signals each of which being a product of amplification by a gain of the detector signal, each gain being distinct and having a predetermined gain value;

selecting as an output signal one of the plurality of amplified detector signals;

switching the selection as output signal to another one of the plurality of amplified detector signals in response to the output signal reaching one of a plurality of thresholds, wherein the plurality of thresholds are predetermined, in a pre-calibration, based on the predetermined gain values and amplitudes of the output signal in order to substantially avoid saturation of an analog-to-digital converter and sense detectable power levels across the range;

converting the switched output signal from an analog signal to a digital signal with the analog-to-digital converter; and associating the power level to the output signal, wherein the switching increases the range of power levels that are detectable.

2. The method of claim 1, wherein the switching to another one of the plurality of amplified detector signals substantially avoids saturation of the analog-to-digital converter by switching to a lower predetermined gain value for amplification of the detector signal.

3. The method of claim 2, wherein the switching to another one of the plurality of amplified detector signals allows sensing detectable power levels substantially across the range by switching to a different predetermined gain value for amplification of the detector signal.

4. The method of claim 3, wherein the different predetermined gain value for amplification of the detector signal is either higher or lower than the predetermined gain value preceding it, depending on the output signal approaching amplitude of saturation of the analog-to-digital converter or undetectably small power level.

5. The method of claim 1, wherein first and second thresholds from among the plurality of thresholds are associated with first and second predetermined gain values, respectively, and wherein the first threshold is higher than the second threshold and the first predetermined gain value is higher than the second predetermined gain value.

6. The method of claim 5, wherein the first predetermined gain value is used to produce the selected one of the amplified detector signals and the second predetermined gain values is used to produce the selected other one of the amplified detector signals, such that the first threshold determines when switching from one to another one of the amplified detector signals.

7. The method of claim 1, wherein the power level of the source signal is detected via the association to the output signal.

8. The method of claim 1, further comprising coupling a portion of the source signal to an input of a detector by sampling signal transmission over a medium between an RF (radio frequency) signal source and an antenna.

9. The method of claim 8, further comprising biasing the detector.

10. The method of claim 1, further comprising filtering the detector signal.

11. The method of claim 1, further comprising buffering the detector signal.

12. The method of claim 1, wherein the switching includes hysteresis to substantially avoid rapid switching.

13. A system for detecting power in a communication system, comprising:
- means for providing a source signal that has a power level within a range;
- means for generating a detector signal with a magnitude relative to the power level of the source signal;
- means for generating a plurality of amplified detector signals each of which being a product of amplification by a gain of the detector signal, each gain being distinct and having a predetermined gain value;
- means for selecting as an output signal one of the plurality of amplified detector signals;
- means for switching the selection as output signal to another one of the plurality of amplified detector signals in response to the output signal reaching one of a plurality of thresholds, wherein the plurality of thresholds are predetermined, in a pre-calibration, based on the predetermined gain values and amplitudes of the output signal in order to substantially avoid saturation of an analog-to-digital converter and sense detectable power levels across the range;
- means to convert the switched output signal from an analog signal to a digital signal; and
- means for associating the power level to the output signal, wherein the switching increases the range of power levels that are detectable.

14. The system of claim 13, wherein the switching to another one of the plurality of amplified detector signals substantially avoids saturation of the analog-to-digital converter by switching to a lower predetermined gain value for amplification of the detector signal.

15. The system of claim 13, wherein the switching to another one of the plurality of amplified detector signals allows sensing detectable power levels substantially across the range by switching to a different predetermined gain value for amplification of the detector signal.

16. The system of claim 15, wherein the different predetermined gain value for amplification of the detector signal is either higher or lower than the predetermined gain value preceding it, depending on the output signal approaching amplitude of saturation of the analog-to-digital converter or undetectable small power level.

17. The system of claim 13, wherein first and second thresholds from among the plurality of thresholds are associated with first and second predetermined gain values, respectively, and wherein the first threshold is higher than the second threshold and the first predetermined gain value is higher than the second predetermined gain value.

18. The system of claim 17, wherein the first predetermined gain value is used to produce the selected one of the amplified detector signals and the second predetermined gain values is used to produce the selected other one of the amplified detector signals, such that the first threshold determines when switching from one to another one of the amplified detector signals.

19. The system of claim 18, further comprising means for biasing the detector.

20. The system of claim 13, further comprising signal conversion means for receiving the output signal and producing a signal for used in the association of the output signal to power level of the source signal.

21. The system of claim 20, wherein the signal conversion means includes the analog-to-digital (ADC) converter.

22. The system of claim 13, wherein the means for generating the detector signal includes a detector, the system further comprising means for coupling a portion of the source signal to an input of the detector by sampling source signal transmission over a medium between an RF (radio frequency) signal source and an antenna.

23. The system of claim 13, further comprising means for filtering the detector signal.

24. The system of claim 13, further comprising means for buffering the detector signal.

25. The system of claim 13, wherein the means for switching provides hysteresis to substantially avoid rapid switching.

* * * * *

UNITED STATES PATENT AND TRADEMARK OFFICE
CERTIFICATE OF CORRECTION

PATENT NO. : 7,555,270 B2 Page 1 of 1
APPLICATION NO. : 11/679025
DATED : June 30, 2009
INVENTOR(S) : Yen-Fang Chao et al.

It is certified that error appears in the above-identified patent and that said Letters Patent is hereby corrected as shown below:

Title page, item (73), "Morrisville, SC" should be changed to --Morrisville, NC--.

Signed and Sealed this

Twenty-seventh Day of October, 2009

David J. Kappos
*Director of the United States Patent and Trademark Office*